United States Patent [19]

Whitehead

[11] Patent Number: 4,469,553
[45] Date of Patent: Sep. 4, 1984

[54] SYSTEM FOR MANUFACTURING, CHANGING, REPAIRING, AND TESTING PRINTED CIRCUIT BOARDS

[75] Inventor: Robert E. Whitehead, Irving, Tex.

[73] Assignee: Electronic Packaging Co., Dallas, Tex.

[21] Appl. No.: 508,349

[22] Filed: Jun. 27, 1983

[51] Int. Cl.³ .................. G01R 15/12; B44C 1/22; C03C 15/00; C23F 1/02
[52] U.S. Cl. ..................... 156/627; 156/64; 156/378; 156/379; 156/629; 324/73 PC
[58] Field of Search .............. 156/626, 627, 629, 645, 156/345, 64, 94, 378, 379, 902, 901; 29/705, 721, 829, 833, 835, 837, 846, 854; 324/51, 52, 73 PC; 434/338, 339

[56] References Cited

U.S. PATENT DOCUMENTS 3,753,816 8/1973 Feldstein et al. ............... 430/314 X
4,220,917 9/1980 McMahon ...................... 357/70 X

*Primary Examiner*—William A. Powell
*Attorney, Agent, or Firm*—Richards, Harris & Medlock

[57] ABSTRACT

A printed circuit board operation system includes a work station for receiving, orienting and retaining a printed circuit board to be operated upon. A product storage array is located adjacent the work station and comprises structure for storing and designating individual components to be assembled onto the printed circuit board in the work station. A visual image projection system is provided for generating a series of visual images each comprising an operational step to be performed on the printed circuit board. Each image is projected in a location and in an orientation corresponding to the correct positioning and orientation of the operation to be performed on the printed circuit board. Verbal instruction generating structure is also provided for producing a series of verbal instructions corresponding to the operational steps. The printed circuit board operation system may be utilized to direct the assembly, repair, modification or testing of printed circuit boards.

56 Claims, 13 Drawing Figures

SYSTEM FOR MANUFACTURING, CHANGING, REPAIRING, AND TESTING PRINTED CIRCUIT BOARDS

TECHNICAL FIELD

This invention relates generally to the fabrication, updating, repair and testing of printed circuit boards, and more particularly to a fully automated system for guiding an operator through each step in a series of operations relative to printed circuit boards.

BACKGROUND AND SUMMARY OF THE INVENTION

As is well known, a printed circuit board comprises a support structure formed from an electrically insulative material having formed on at least one side thereof a series of electrically conductive paths or leads. Typically, a plurality of apertures are formed through the board, and components such as resistors, capacitors, transistors, integrated circuits, etc. are mounted on the board by the insertion of electrically conductive pins extending from each component through the apertures. Solder connections are then formed between the conductive pins of the components and the conductive leads of the printed circuit board, thereby completing the necessary electrical connections between the various components.

As will be readily apparent, when a particular printed circuit board requires the replacement, addition, removal and/or testing of numerous components, many opportunities exist for operator error. For example, many types of components are almost identical in appearance, but widely differ in function. When the design of a particular printed circuit board requires the positioning of different types of components in relatively adjacent locations, the mounting or testing of components in incorrect locations or the removal of components from incorrect locations can usually occur. In addition, integrated circuits and other components often have a particular polarity. Even when the conductive pins of such a component are positioned in a correct aperture, the orientation of the component may be reversed, which means that the polarity of the component is incorrect. It will be understood that if the conductive pins of a particular component are positioned in the wrong apertures or if a component is mounted in the wrong orientation, and if such errors are not detected until after the completion of subsequent steps in the printed circuit board operation, costly and time consuming rework procedures may be necessary in order to salvage the printed circuit board. In some cases the extent of these procedures may be such that it is impractical to attempt salvage, whereupon the board must be scrapped. Similarly, costly and time consuming rework procedures may be caused unnecessarily by mistakenly testing the wrong component of a printed circuit board since the tested component would likely be a different type than the intended component and therefore incorrectly identified as being defective.

A related problem involves the fact that it is often necessary to assemble, modify, repair and/or test a complex printed circuit board in accordance with a predetermined schedule. Unless the schedule is strictly adhered to it may be difficult or impossible to carry out subsequent steps in any associated process. Here again, any deviation from the correct schedule may require costly and time consuming rework procedures.

Recognition of the foregoing problems has led to prior attempts at automating the assembly, modification, repair and/or testing of printed circuit boards. For example, one prior system includes structure for projecting a beam of light at the particular set of apertures which are to receive the next component of the printed circuit board. Such a system may be utilized in conjunction with a previously prepared component list, so that the operator can select components in sequence from the list and then insert each component at the location indicated by the projected light beam. Although such a system is certainly preferable to no system at all, various deficiencies with respect to the full automation of printed circuit board assembly remain. For example, a projected light beam type system does not include any procedure for guiding the operator with respect to component orientation, so that even though the correct component is positioned in the correct apertures its polarity may be reversed. Also, it is entirely conceivable that the operator would skip ahead or fall behind relative to the list, leading to the insertion of an incorrect component in the apertures indicated by the projected light beam.

As is well known in the industry, engineering change notices are frequently issued regarding previously manufactured printed circuit boards. For example, a particular printed circuit board model may incorporate design deficiency, or it may become desirable to rework a printed circuit board model to accommodate changing circumstances or to facilitate the performance of new or revised functions. Heretofore, no system has been provided for automating the reworking of printed circuit boards in accordance with engineering change notices.

Another well known deficiency has to do with the repair of defective printed circuit boards. At the present time there does not exist a commercially practical system for automating the repair of defective printed circuit boards and the associated testing of the boards prior to or following repair.

The present invention comprises a system for manufacturing, changing, repairing and/or testing printed circuit boards which overcomes the foregoing and other problems long since associated with the prior art. In accordance with certain aspects of the invention, each step of operations to be performed on a printed circuit board is characterized by the projection of a full color image of the component to be inserted, replaced, removed and/or tested at the precise location on the printed circuit board at which the component is situated or the repair opertion is to take place. Each step of a procedure is also characterized by verbal instructions to the operator relating to a particular component and the operation to be performed thereon or to a particular repair operation and the location thereof. Any step in the procedure may include a visual indication to the operator as to the particular component to be selected from a component storage array. Thus, at each step in the printed circuit board assembly, repair, modification and/or testing process the operator is visually and verbally instructed as to which component to mount, remove or test, and is then visually and verbally instructed as to the location of the component on the printed circuit board and as to the proper orientation of the component if necessary.

In accordance with yet another aspect of the invention, the step by step process of inserting, removing and/or testing components is periodically interrupted for a review of the previously accomplished steps. For example, assume that the assembly procedure has progressed to the point that all of the integrated circuits should be in place. At this time an image can be projected onto the printed circuit board showing the entire array of integrated circuits which are to comprise the completed printed circuit board, including the proper location and orientation of each integrated circuit. At this time the operator can also receive verbal instructions as to the proper number of integrated circuits, and as to the proper location and orientation of each. This allows any previous error as to component selection, positioning or orientation to be immediately corrected in advance of subsequent assembly steps which might significantly complicate the correction process. A similar procedure may also be incorporated with modification, repair, or testing operations.

In accordance with more specific aspects of the invention, a printed circuit board assembly system includes a work station adapted to properly position a printed circuit board for the assembly of components therein. All of the components necessary for the assembly of a particular printed circuit board are arranged in a predetermined component array situated immediately adjacent the work station. Structure is provided for projecting component images, either directly onto the printed circuit board or onto a display screen oriented to facilitate comparison of the image on the screen with the component being inserted into the printed circuit board. Structure is also provided for verbally instructing the operator as to each step of the assembly procedure, and as to the precise location of the next component to be selected from the component array.

The invention further comprises a system for automating the implementation of engineering change notices pertaining to printed circuit boards. In a typical case, a series of visual images and a corresponding series of verbal instructions are first generated to facilitate the cutting of one or more electrically conductive leads or paths previously formed on the etched face or underside of the circuit board. Next, a series of visual images and a corresponding series of verbal instructions are generated with respect to the information of new conducting paths between predetermined points on the printed circuit board. The new circuit paths may comprise lengths of insulated wire extending either point-to-point or in accordance with predetermined coordinates and are adhesively secured in place.

Still another aspect of the invention involves the testing and repair of defective printed circuit boards. If the defect is not known, the system of the present invention may be utilized to conduct a series of tests for the purpose of identifying the component or components that are causing the defect. Then, the system is utilized in a manner similar to that described above in conjunction with the manufacture of printed circuit boards to facilitate the removal and replacement of the defective component or components. Finally, the system is used to test the repaired printed circuit board to be sure that all of the defects therein have been corrected.

DESCRIPTION OF THE DRAWINGS

A more precise understanding of the invention may be had by reference to the following Detailed Description when taken in conjunction with the accompanying Drawings, wherein.

DETAILED DESCRIPTION

Figure 1:
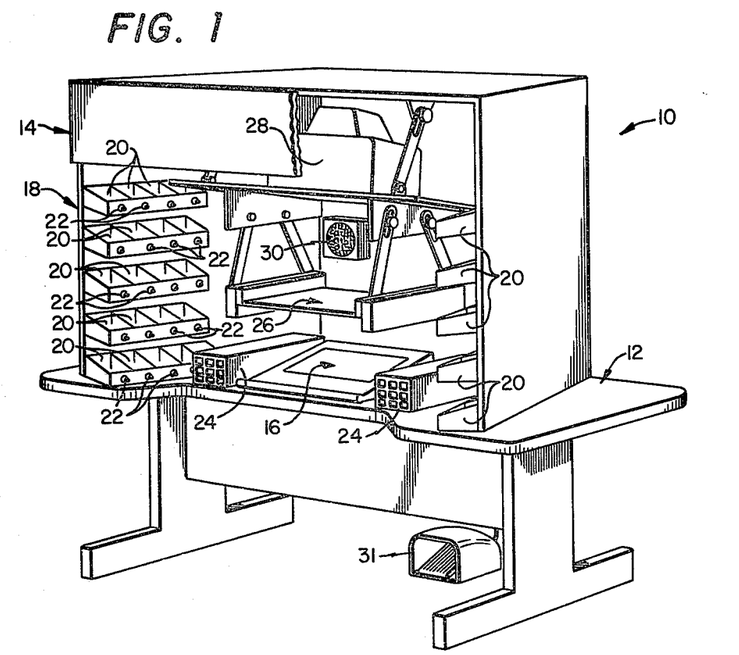
FIG. 1 is a perspective view of a system for manufacturing, changing and repairing printed circuit boards incorporating a first embodiment of the invention.
Figure 2:
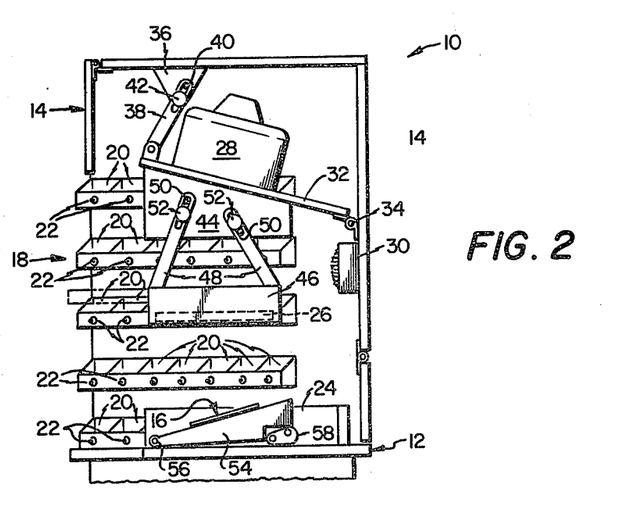
FIG. 2 is a side view of the upper portion of the system of FIG. 1 in which certain component parts have been broken away more clearly to illustrate certain features of the invention.

Referring now to the Drawings, and particularly to FIGS. 1 and 2 thereof, there is shown a system for manufacturing, changing, repairing and/or testing printed circuit boards 10 incorporating the first embodiment of the invention. The system 10 includes a base 12 serving to support and position the remaining components of the system. The purpose of the base 12 is to merely position the operating components of the system 10 for the comfort and convenience of an operator, and the particular design thereof comprises no part of the present invention.

A cover or housing 14 is supported on the base 12. The housing 14 serves to isolate the various optical components of the system 10 from ambient light. The housing 14 also protects both the printed circuit board being worked on and the operating components of the system 10 from undue exposure to dust and other contaminants.

The system 10 further includes a work station 16 adapted to receive, orient and retain a printed circuit board to be assembled, changed, repaired or tested. Work station 16 may comprise various conventional types of article locating and retaining structures. For example, the work station 16 may comprise suitable guides for locating a printed circuit board, together with a plurality of vacuum ports for retaining the printed circuit board in the proper orientation. Alternatively, the work station 16 may comprise a series of guides for properly orienting a printed circuit board, together with one or more conventional clamps for retaining the oriented printed circuit board in place. A component array 18 is located wihtin the housing 14 adjacent the work station 16. The component array 18 comprises a series of component storage bins 20 each having an identification lamp 22 thereon. Identification lamps 22 may comprise any of the various conventional designs, including in particular light emitting diodes. The component array 18 further includes one or more integrated circuit dispensers 24. The integrated circuit dispensers 24 are preferably of the type which dispense individual integrated circuit components, each of a preselected type, upon receipt of a predetermined input signal.

A half mirror 26 is positioned directly above the work station 16 and directly in the line of sight of an operator situated in a seated orientation directly in front of the work station 16. An image projection apparatus 28 is in turn positioned above the half mirror 26. The purpose of the image projection apparatus 28 is to direct a series of images onto the half mirror 26, whereby the operator is instructed as to the operations to be performed relative to a printed circuit board positioned at the work station 16. A speaker 30 is situated within the housing 14 for providing verbal instructions to the operator.

Referring particularly to FIG. 2, the image projection apparatus 28 is mounted on a subframe 32 which is supported on the rear of the housing 14 by hinge 34. The front of the subframe 32 is secured to a bracket 36 depending from the top of the housing 14 by means of an arm 38 having a slot 40 formed therein. The slot 40 receives a fastener 42 which is threadedly engaged with the bracket 36. This facilitates the positioning of the image projection apparatus 28 at any desired orientation relative to the remaining components of system 10.

A pair of brackets 44 extend downwardly from the subframe 32. The half mirror 26 is supported in opposed frames 46 having arms 48 extending upwardly therefrom. The arms 48 have slots 50 formed in the upper ends thereof which receive fasteners 52 that are threadedly engaged with the brackets 44. This permits orientation of the half mirror 26 both with respect to the image projection apparatus 28 and with respect to the operator.

The work station 16 includes a subframe 54 having a front edge which is pivotally supported by means of a hinge 56. A cam 58 is provided for selectively pivoting the rear of the subframe 54 about the axis of the hinge 56. By this means the orientation of the work station 16 may be adjusted to suit the comfort and convenience of the operator.

In the use of the system for manufacturing, changing, repairing and testing printed circuit boards 10 a printed circuit board is initially positioned at the work station 16. Once the printed circuit board has been properly located and retained in the work station 16, the orientation of the printed circuit board is typically not changed until all of the required operations with respect thereto have been completed.

Assuming that the present invention is used to manufacture the printed circuit board, the assembly procedure is carried out in accordance with a predetermined sequence. Each step in the sequence is characterized by the illumination of one of the component identification lamps 22 to indicate to the operator the location of one of the particular bins 20 containing the next component to be mounted on the printed circuit board. In lieu of the illumination of one of the lamps 22, one of the integrated circuit dispensers 24 may be actuated to dispense a particular integrated circuit comprising the next component to be assembled onto the printed circuit board. In either event, the component array 18 is addressed at each step in the printed circuit board assembly procedure to indicate to the operator the precise component that is to be mounted on the printed circuit board during the particular assembly step.

Each step of the printed circuit board assembly sequence is further characterized by actuation of the image projection apparatus 28 to project a predetermined image onto the half mirror 26. The image that is projected by the apparatus 28 comprises a full color illustration of the particular component that is to be mounted on the printed circuit board at the time. The image of the component is projected onto the half mirror 26 at a location which precisely corresponds to the correct positioning of the component on the printed circuit board. Moreover, the orientation of the image of the component on the half mirror 26 is identical to the correct orientation of the component on the printed circuit board. Thus, after the operator has been directed to select a particular component from the array 18, the image projection apparatus 28 instructs the operator as to the positioning and orientation of the component on the printed circuit board.

The use of the half mirror 26 comprises an important feature of the invention. Thus, by means of the half mirror 26 the image projection apparatus 28 displays the full color image of the particular component being assembled directly in the line of sight of the operator. At the same time, the half mirror 26 provides the operator with a full view of the printed circuit board on the work station 16. By this means the image projected onto the half mirror 26 by the apparatus 28 may be compared with the component being mounted on the printed circuit board, both as to its correct positioning and as to its correct orientation.

The speaker 30 is utilized to provide verbal instructions to the operator which reinforce the previously described visual instructions as to component selection and installation. Thus, in addition to the actuation of one of the component selection lamps 22 or one of the integrated circuits dispensers 24, the speaker 30 is utilized to provide verbal instructions to the operator as to component selection. Likewise, in addition to the projection of the full color image of the component being installed on the half mirror 26 by the image projection apparatus 28, the speaker 30 is utilized to provide verbal instructions to the operator as to component position and orientation. By this means it is virtually impossible for the operator to select the wrong component or to improperly position the component or to improperly orient the component as it is mounted on the printed circuit board situated at the work station 16.

The printed circuit board assembly system 10 may also be utilized to provide a review of previously completed component assembly steps. For example, assume that the first ten components have been assembled onto the printed circuit board. The image projection apparatus can then be utilized to project a full color image of all ten components, each properly positioned and each properly oriented relative to the printed circuit board. Simultaneously, the speaker 30 may be utilized to provide a verbal review of the proper positioning and/or orientation fo the first ten components. By this means any error which may have occurred in the assembly procedure may be quickly detected and corrected.

Figure 3:
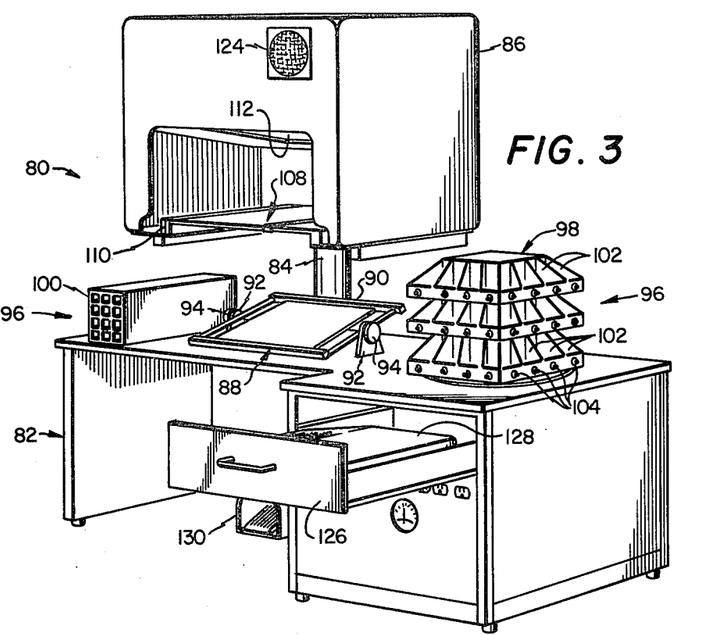
FIG. 3 is a perspective view of a system for manufacturing, changing and repairing printed circuit boards incorporating a second embodiment of the invention.
Figure 4:
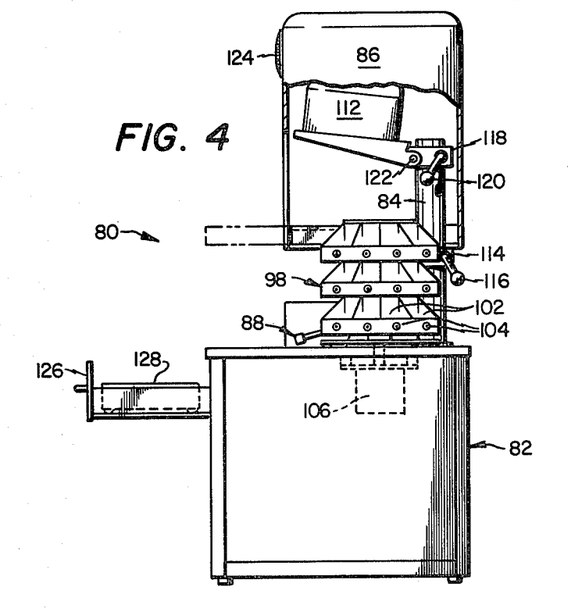
FIG. 4 is a side view of the system of FIG. 3 in which certain component parts have been broken away more clearly to illustrate certain features of the invention.

Referring now to FIGS. 3 and 4, there is shown a system for manufacturing, changing, repairing or testing printed circuit boards 80 incorporating a second embodiment of the invention. The system 80 includes a console 82 which generally takes the form of a desk. The console 82 serves to support certain components of the system 80, and to enclose certain other components. A pedestal 84 extends upwardly from the console 82, and a housing 86 is supported on the pedestal 84. The housing 86 encloses certain components of the system 80.

The system 82 includes a work station 88. The work station 88 includes a frame 90 which is supported on brackets 92 extending upwardly from the console 82. Adjustment knobs 94 are provided for first releasing the frame 90 so that it may be adjusted to suit the comfort and convenience of the operator, and then tightening the frame 90 relative to the brackets 92 so that the frame remains in the preferred orientation.

The system 80 further includes a component selection array 96 including a carousel 98 and an integrated circuit dispenser 100 positioned on opposite sides of the work station 88. The carousel 98 comprises a plurality of bins 102 each having a component identification lamp 104 individual thereto. The carousel 98 comprises a frame which is supported for rotation about a vertical axis to position a predetermined set of bins 102 and their corresponding component identification lamps 104 at a rotational orientation which is most convenient to the operator. As is best shown in FIG. 4, a drive motor 106 is provided for selective actuation to rotate the carousel 98. The integrated circuit dispenser 100 is adapted to dispense a predetermined variety of integrated circuits in response to a preselected input signal.

A half mirror 108 is positioned directly above the work station 88. The half mirror 108 is mounted on a slide 110 and is thereby selectively extendable and retractable relative to the housing 86 and relative to the work station 88. An image projection apparatus 112 is in turn mounted directly above the half mirror 108.

As is best shown in FIG. 4, a clamping apparatus 114 is utilized to secure the housing 86 at a predetermined vertical location on the pedestal 84. The clamping apparatus 114 includes a handle 116 which is adapted for selective actuation to either release or engage the clamping apparatus 114 relative to the pedestal 84. By this means the housing 86 and the half mirror 108 carried thereby are selectively positionable relative to the work station 88.

Likewise, a clamping apparatus 118 is utilized to secure the image projection apparatus 112 on the pedestal 84. The clamping apparatus 118 includes a handle 120 which is adapted for selective actuation to either release or engage the clamping apparatus 118 relative to the pedestal 84. It will thus be understood that although the image projection apparatus 112 is enclosed within the housing 86, it is nevertheless adapted for selective positioning relative thereto. The angular positioning of the image projection 112 is also selectively positionable by means of a hinge 122.

The system 80 further includes a speaker 124. The speaker 124 is illustrated as mounted on the housing 86. However, the precise location of the speaker 124 is not critical to the practice of the invention. The purpose of the speaker 124 is to provide verbal instructions to the operator of the system 80 which serve to reinforce the visual instructions provided to the operator by the image projection apparatus 112, the lamps 104 and the integrated circuit dispenser 100.

The console 82 includes a drawer 126. The drawer 126 encloses a keyboard 128, being understood that the keyboard 128 may be otherwise located on the console 82, if desired. The function of the keyboard 128 is to input a series of instructions comprising the particular sequence of steps that is to be executed in the manufacture, change, repair or test of a printed circuit board. The keyboard 128 may also be utilized to change or amend a previously prepared sequence of instructions or to input information which is used in a previously prepared sequence of instructions such as the location and type of a particular component or repair step.

The system 80 further includes a foot pedal 130. In many applications of the invention, the foot pedal 130 is utilized by the operator to signal the completion of a particular step in a sequence of operations relative to a printed circuit board. Upon actuation, the foot pedal 130 initiates the advance of the sequence to the next step. In order applications of the invention the foot pedal 130 may be dispensed of a timing circuit which advances the sequence in accordance with a preselected time interval or set of time intervals.

In the use of the system 80, a printed circuit board is first positioned at the work station 88. The work station 88 includes guides for precisely orienting the printed circuit board, and further includes clamping apparatus for securing the properly oriented printed circuit board in position.

After the printed circuit board has been properly oriented and clamped in place, the system 80 is actuated through a series of steps comprising instructions for the proper assembly of a printed circuit board, for the implementation of an engineering change notice pertaining to a printed circuit board for the repair of a printed circuit board or for the testing of a printed circuit board. Each step may include the actuation of either the integrated circuit dispenser 100 or one of the lamps 104 to indicate the particular component which is to be installed at that time. Simultaneously, the image projection apparatus 112 displays a full color image of the component to be installed, removed or tested or a full color image of the modification to be made to the printed circuit board on the half mirror 108. In the operation of the image projection apparatus 112, the full color image of the component, etc. is displayed at the correct location and in the correct orientation relative to the printed circuit board in the work station 88. Thus, during circuit board assembly the operator is visually instructed as to the proper component to be installed, as to the proper installation location for the component, and as to the proper installation orientation of the component being installed in the printed circuit board, or in the case of a change, repair or test, the nature and location of the operation to be performed.

In addition to visual instructions, the system 80 provides verbal instructions as to the proper selection, proper positioning and proper orientation of the component to be installed or other operation to be performed. The verbal instructions are provided by means of the speaker 124. The verbal instructions are intended as a supplement to the visual instructions, so that the operator receives both visual and verbal inputs as to the manufacture, change, repair or test of the printed circuit board.

At the completion of each step in the sequence, the operator actuates the foot pedal 130. The sequence is thereby advanced one step. At predetermined intervals the sequence may be interrupted to provide a check on the steps that have been previously carried out. For example, such a checking step may include a display of all of the components which have been previously installed, with each of the components displayed in full color, in its proper position and in its proper orientation. At the same time the operator is provided with verbal checking instructions through the speaker 124. This allows any errors in the procedure to be corrected before the assembly procedure has reached a point that correction of such errors would be difficult. Similar review procedures may be used in conjunction with the implementation of engineering change notices, repairs and/or tests relative to the printed circuit board.

Figure 5:
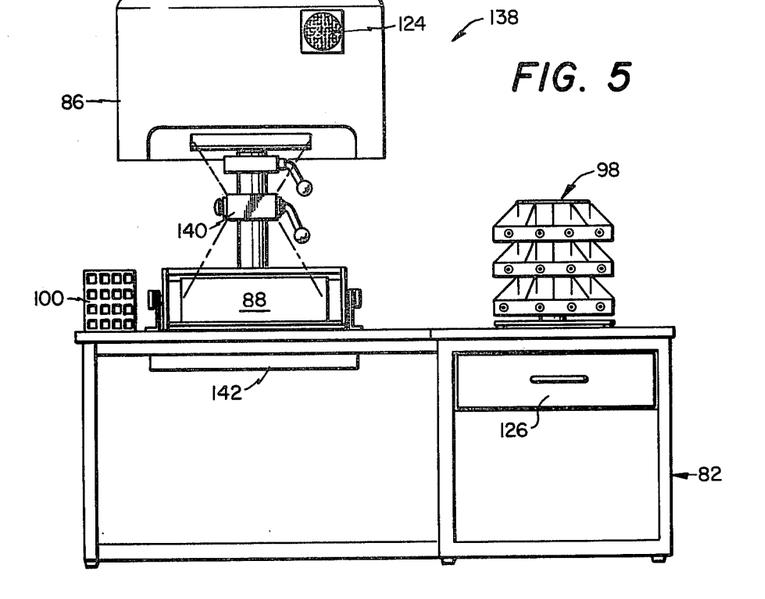
FIGS. 5 and 6 are similar to FIGS. 3 and 4 showing a variation of the second embodiment of the invention.
Figure 6:
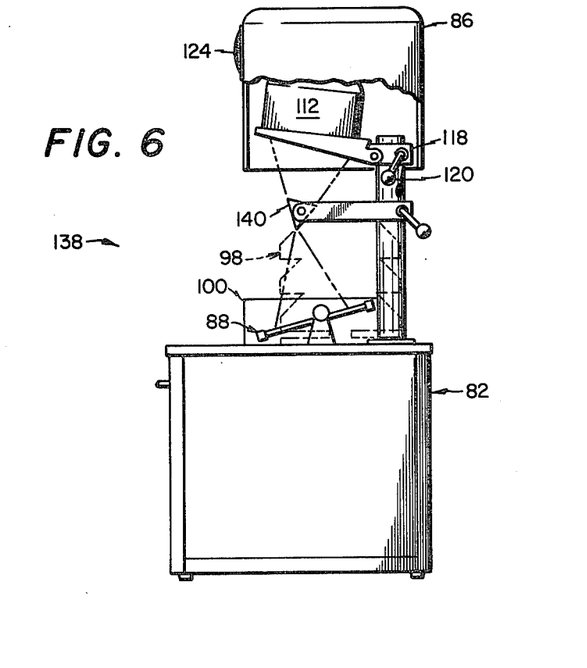

FIGS. 5 and 6 illustrate a system for manufacturing, changing, repairing and/or testing a printed circuit board 138 comprising a variation of the second embodiment of the invention. A prism 140 is used in lieu of the half mirror 108. The prism 140 projects images directly onto a printed circuit board held by work station 88, which may include a back light 142. Although the embodiment of FIGS. 5 and 6 incorporates a prism, other optical projection techniques may be utilized for the projection of full color component images directly on the printed circuit board surface.

Figure 7:
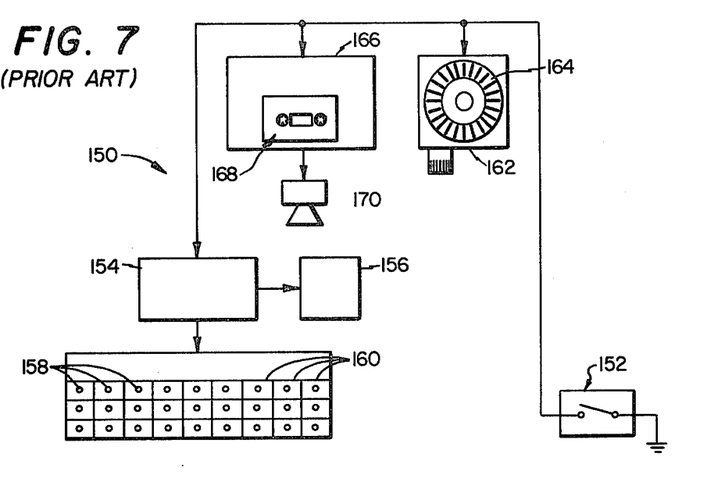
FIG. 7 is a schematic illustration of the operating components of a prior art printed circuit board assembly system.

Referring now to FIG. 7, a prior art operating system 150 which may be utilized in conjunction with any of the foregoing embodiments of the invention is illustrated. The operating system 150 includes a switch 152 which may comprise a foot switch, a manually operated switch, or a switch which is periodically actuated in response to a predetermined time interval or set of time intervals. Upon closure, the switch 152 actuates a component selection indicator 154.

Upon actuation, the component selection indicator advances one step. Following its advance, the component selection indicator actuates either an integrated circuit dispenser 156 or one of a plurality of component selection indicator lamps 158. Each of the lamps 158 is individual to a bin 160 containing a plurality of identical components for use in assembly, modification, repair and/or testing of printed circuit boards. For example, upon actuation, the component selector indicator 154 may provide an indication of the component to be installed on the printed circuit board if the operator is so directed by that step of the procedure.

Actuation of the switch 152 also advances the operation of a visual image projection apparatus 162. In this case the visual image projection apparatus 162 comprises a slide projector of the type adapted to sequence upon receipt of an electrical input signal. The apparatus 162 includes a cartridge 164 containing a series of photographic slides which comprise the sequence of steps desired in the assembly, modification, repair and/or testing of a particular printed circuit board. Upon each actuation of the switch 152 a previous slide is withdrawn and the next slide is projected by the apparatus 162. The particular slide, which represents an operational step, may comprise a full color image of the component to be installed in, removed from or tested on the printed circuit board, with the component being precisely positioned and oriented relative to the printed circuit board. Full color images representing repair steps or engineering design changes may also be implemented with appropriate slides. Alternatively, the slide may comprise the image of a plurality of previously directed steps, with each of the components, repairs or modifications being shown in full color and in the precise position and orientation that is required for the particular printed circuit board. In the latter instance the slide is part of a rechecking step in the sequence for assembly, modification, repair and/or testing of the printed circuit board.

Actuation of the switch 152 also initiates actuation of a tape player 166. The tape player 166 includes a cartridge 168 which is individual to the particular operational sequence to be performed on a particular circuit board. Upon actuation, the tape player 166 reproduces a set of verbal instructions which have been previously recorded on the cartridge 168, and the verbal instructions are transmitted through a speaker 170. The operation of the tape player 166 may continue for a predetermined time interval. Alternatively, the cartridge 168 may include a recording at a particular frequency which signals the end of each particular segment of the instructions thereon.

In addition to applications relating to assembly procedures, it will be apparent that system 150 is similarly applicable to modification procedures which may be necessary to implement engineering change notices. Further, specific repair and/or testing operations on a particular printed circuit board may be directed by system 150 if appropriate photographic slides, verbal instructions, and component indications are incorporated therewith.

It will thus be understood that the system 150 comprises a set of components which are readily adaptable to the practice of the present invention. In the use of the system 150 it is merely necessary to prepare a set of slides for the projector 162 which incorporate the desired images. Likewise, a cartridge 168 comprising a set of verbal instructions for the particular printed circuit board assembly, modification, repair and/or testing sequence is prepared. Finally, the component selector indicator 154 is wired to either actuate the integrated circuit dispenser 156 or a particular lamp 158 in accordance with the particular step of the procedure.

Figure 8:
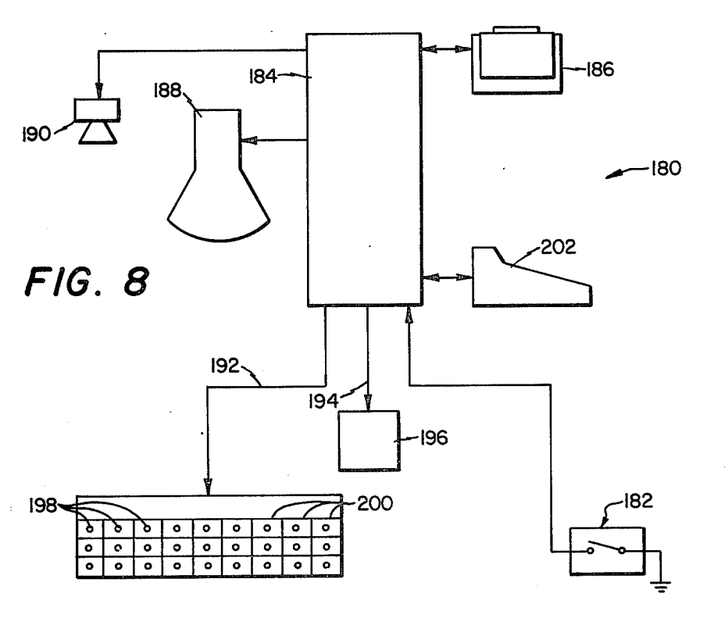
FIG. 8 is a schematic illustration of a printed circuit board assembly system incorporating the invention.

Referring now to FIG. 8, there is shown an advanced system 180 not heretofore known to those skilled in the art, which may be utilized to operate any of the embodiments of the invention previously described herein. The system 180 incorporates a switch 182 which may be either a foot switch, a manually operated switch or a switch which is operated in response to a predetermined time sequence or a set of predetermined time sequences. The switch 182 comprises an input to a computer 184. The computer 184 may be of the type known as an "APPLE II" computer. Instructions for programming such a computer are readily available from a manufacturer thereof.

The computer 184 is programmed to operate a plurality of components comprising the system 180. One such component is a disc drive 186. Disc drive 186 may be adapted to receive a particular disc individual to the assembly, modification, repair and/or testing instructions for a particular printed circuit board. Such a disc comprises a memory which receives and stores a series of instructions comprising the desired sequence relating to a particular printed circuit board. A disc drive 186 thus operates in conjunction with the computer 184 to generate each step in a sequence of assembly, modification, repair and/or testing of the particular printed circuit board.

The computer 184 and the disc drive 186 cooperate to actuate a cathode-ray tube (CRT) 188. The CRT 188 comprises an image generating apparatus which may be utilized in any of the embodiments of the invention hereinabove described to provide an image for use with half mirror concept or for projection directly onto a particular printed circuit board. The CRT 188 may in fact comprise a conventional full color visual display apparatus of the type utilized in conjunction with computers such as the "APPLE II" computer.

The disc drive 186 and the computer 184 also operate a speaker 190. In some applications of the invention the computer 184 may have sufficient sophistication to provide a synthesized speech input to the speaker 190. Otherwise, the computer 184 may be utilized to drive a tape recorder which in turn drives the speaker 190.

The computer 184 and the disc drive 186 also provide a pair of outputs 192 and 194. The output 194 is selectively actuated to operate an integrated circuit dispenser 196. The output 192 is selectively actuated to operate one of a plurality of lamps 198. Each of the lamps 198 is individual to a particular bin 200. Each bin 200 contains a plurality of identical components which may be utilized in the assembly, modification, repair and/or testing of a printed circuit board.

Figure 9:
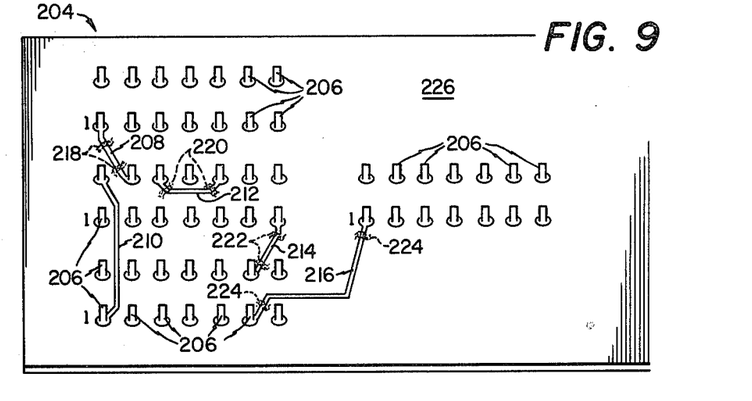
FIGS. 9, 10 and 11 are illustrations of progressive steps in the use of the invention to implement engineering change notices.
Figure 10:
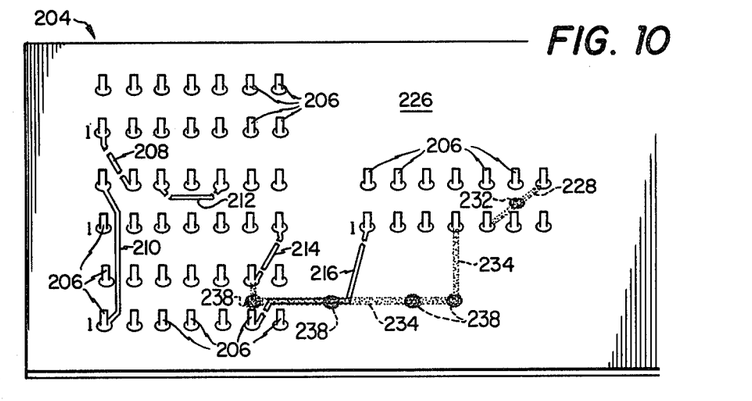
Figure 11:
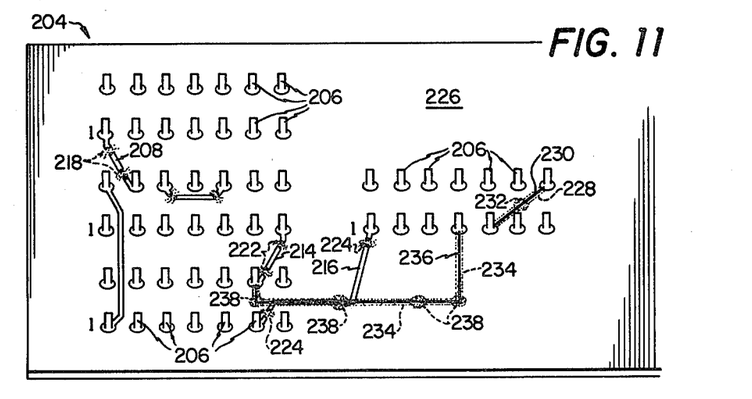

FIGS. 9, 10 and 11 illustrate a hypothetical application of systems 150 or 180 in conjunction with any one of the previously described embodiments to modify the etched face or underside of a printed circuit board. Such modifications include either the cutting of conducting paths which electrically connect two or more component conducting pins or the addition of lead wires to electrically connect two or more component conducting pins. By these means, a defect in a particular printed circuit board may be corrected or the implementation of design modifications of a particular printed circuit board may be accomplished.

Referring more particularly to FIG. 9, the projection of images to direct the cutting of preexisting conducting paths on the etched face of a particular printed circuit board is shown. The etched face 226 of printed circuit board 204 has a number of component conducting pins 206, each extending through an aperture in printed circuit board 204. Lead paths 208–214 connect four pairs of conducting pins 206. In the particular example of FIG. 9, leads paths 208, 212, 214 and 216 are desired to be cut, thereby electrically disconnecting the pairs of component conducting pins 206 which they run between.

Upon initiation of the cutting procedure, a plurality of images, each corresponding to one of the desired cuts, is projected onto a half mirror positioned between the operator and the printed circuit board or directly onto the etched face of the printed circuit board to indicate the precise lead path and location of the cut to be made. Images 218–224, each comprising a pair of parallel lines indicating that portion of their respective lead paths which are to be cut, are projected onto the etched face 226 of printed circuit board 204. It will be apparent to those skilled in the art that a variety of images may be used to indicate desired cutting points and that it may be desirable to indicate any number of cutting points on a particular lead path. FIG. 9 shows the simultaneous display of images 218–224, which indicate all desired lead path cutting points.

Images 218–224 are preferably projected in a sequence corresponding to the order in which the cuts are desired to be made, however, they may be projected simultaneously to show all desired cutting points, as shown in FIG. 9. If images 218–224 are projected in sequence, such sequence may be timed to allow completion of each cutting operation before the images directing the next cutting operation are projected. Alternatively, the sequence may advance only in response to a signal from the operator that a particular cutting operation has been completed, which may be accomplished through appropriate means such as a hand or foot switch, for example. Upon completion of all cutting operations, all images indicating cutting points may be projected simultaneously or sequentially, thus allowing the operator to review the work to be sure that no cutting points were missed and that all cuts completely sever their respective lead paths.

FIG. 10 illustrates a later phase of the modification of printed circuit board 204. At this point, cutting operations are completed, thereby severing each of lead paths 208, 212, 214 and 216 at two points, leaving lead path 210 uncut. The images 218–224 which indicated cutting points on respective lead paths 208, 212, 214 and 216 are no longer projected onto etched face 226. However, images 228 and 234, which indicate the paths along which lengths of lead wire are to be mounted to connect their respective pairs of component conducting pins 206, are projected onto the surface of etched face 226. Along with the lead wire images 228 and 234, images 232 and 238, which represent the points at which adhesive is to be applied to secure the lead wire to the etched face 226, are simultaneously projected onto etched face 226.

Lead wire images 228 and 234 differ in that image 228 is straight, running point to point between a pair of component conducting pins 206, whereas lead wire 234 runs straight only between specified coordinate points on etched face 226 to allow the electrical connection of a pair of component conducting pins 206 which may not have an unobstructed direct path running therebetween. Lead wire images 228 and 234 may either be projected simultaneously onto the surface of etched face 226 following cutting operations or they may be projected in a sequence corresponding to the order in which their respective lead wires are to be added.

FIG. 11 shows the etched face 226 of printed circuit board 204 upon the completion of modification operations having all images indicating desired modifications thereto simultaneously projected onto etched face 226. Lead wires 232 and 234 are affixed to the etched face 226 of printed circuit board 204 by means of a suitable adhesive at locations specified by respective adhesive point images 232 and 238. Lead wires 230 and 236 are preferably insulated, thereby allowing their placement along paths which cross one or more lead paths without forming electrical connection therebetween. In the example illustrated in FIG. 11, all cutting point images 218–224 and lead wire images 228 and 236 are simultaneously projected onto the etched face 226 of printed circuit board 204 after the completion of all modification operations to allow the operator to review and confirm that all desired modifications have been made. However, it may be preferably that all images be projected sequentially to facilitate operator review of each modification individually.

Both system 150 of FIG. 7 and system 180 of FIG. 9 may be implemented to direct a wide variety of modification operations. However, system 180 is decidedly more flexible than system 150 and therefore is most capable of quick and easy adjustment to accommodate modification operation changes and/or different printed circuit boards. Whenever any of such changes are desired to be made, the operator may so instruct the computer 184 through keyboard 202 with reference to a coordinate system defining the etched face of a particular printed circuit board. By this means, various sizes of printed circuit boards may be input to computer 184 along with the locations of apertures and any component connecting pins that may extend therethrough. Thereafter the operator may designate those points on the etched face of the circuit board at which lead paths are to be cut and the paths along which additional lead wires are to be attached to the printed circuit board by referencing the same coordinate system. Such information may be stored on a floppy disk by disk drive 186.

An alternative means of programming computer 184 for the modification of the etched face of a printed circuit board would be to incorporate a CRT on which a printed circuit board and its associated modifications could be plotted either with a cursor or with a plotting pen. Once the printed circuit board and its modification are plotted on the CRT, they would be input to the computer and stored on a floppy disk by disk drive 186 for use in directing the modification operations. Therefore, by means of keyboard 202 or a CRT terminal, system 180 may be easily adapted for use with a wide variety of modifications and printed circuit boards within the limits of the coordinate system being used.

Once modification operations have been initiated by the operator, the computer 184 will generate a plurality of images each corresponding to a specific type and location of a modification in response to a previously input instruction. Such images are then projected onto either a half mirror disposed between the operator and the printed circuit board or directly onto the etched face of the printed circuit board such that the images visually indicate the precise location and type of modification to be made to the printed circuit board. It will be apparent that numerous sequences of generating and projecting the images may be desirable depending upon the particular application of system 180. It will further be apparent that system 180 is capable of storing modifications to be made on numerous different printed circuit boards and is also capable of storing numerous different modifications to be made to a particular printed circuit board.

In addition to the visual display of desired modifications, computer 184 may be programmed to synthesize audible verbal instructions corresponding to the images generated by CRT 188. Alternatively, computer 184 may be programmed to actuate a cassette recorder (not shown), which in turn drives speaker 190 to verbally direct the desired modification operations.

In addition to modifications of the etched face of a particular printed circuit board, the system 180 of FIG. 8 may be used in combination with the embodiments of FIGS. 1-6 to direct modifications in the repair of a printed circuit board or to implement engineering design changes by removing or substituting components for those already present in a previously assembled printed circuit board.

Figure 12:
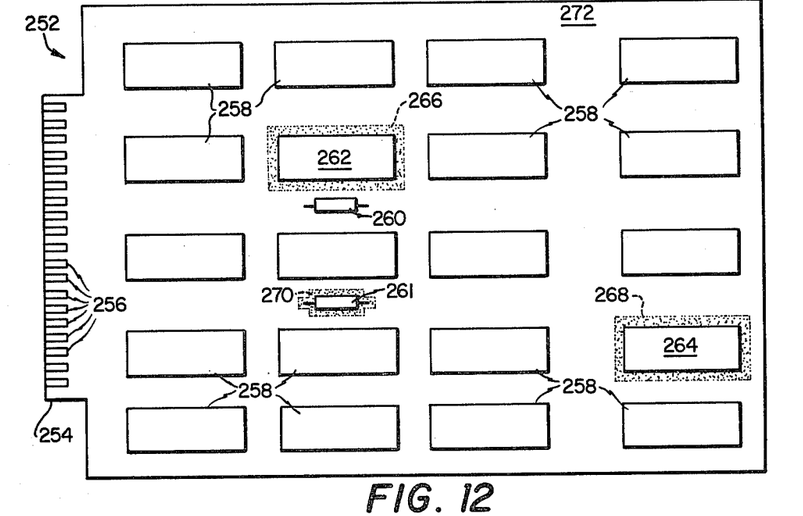
FIGS. 12 and 13 are illustrations relating to the use of the invention in the testing and repair of printed circuit boards.

FIG. 12 shows the component face 172 of a printed circuit board 252. Printed circuit board 252 has a connector tab 254 comprising an extension of a portion of one end of printed circuit board 252 which serves as a supporting surface for a plurality of contacts 256. Contacts 256 are in electrical connection with conducting paths running along the etched face of printed circuit board 252 and are disposed on the surface of connector tab 254 such that when connector tab 254 is plugged into an appropriate receptacle of an electronic system, electrical connection between the system and printed circuit board 252 is established by contacts 256. A plurality of integrated circuits 258 and components 260 and 261 are disposed at spaced locations on component face 272 of printed circuit board 252. Integrated circuits 258 and components 260 and 261 are electrically connected to the etched face of printed circuit board 252 by means of their respective conducting pins which pass through specifically located apertures in printed circuit board 252.

Upon initiation of modification operations, any component of printed circuit board 252 which is to be removed will be identified by projecting a full color image depicting the particular component either onto a half mirror disposed between the operator and the printed circuit board or directly onto the printed circuit board itself such that the precise location of the component is identified.

In the hypothetical modification operations illustrated in FIG. 12, integrated circuits 262 and 264 and component 261 are to be removed. Images 266-270 are projected either onto the half mirror or directly onto the component face 272 of printed circuit board 252 so as to indicate the precise location and type of component which is to be removed. It will be apparent to those skilled in the art that such images may be projected simultaneously or sequentially as discussed previously with respect to similar assembly, repair and/or modification operations.

Once a particular component has been removed from circuit board 252, a component of the same type may be substituted therefore, such as in repair operations, or a component of a different type may substituted therefor, such as in operations implemeneting design changes. In either case, image projections and verbal instructions may be combined with the designation of a specific component in an array of components, as discussed previously with respect to FIGS. 1-8, to insure substitution with the correct component and to insure placement thereof in the correct location and orientation on the printed circuit board.

The particular type of component to be removed from printed circuit board 252 and its precise location, along with any other instructions concerning the location and type of component to be substituted therefor, may be input to computer 184 through keyboard 202 and stored in a floppy disk by disk drive 186. such information may be supplied for repair operations by in-circuit testers which are designed to identify defective components in a previously assembled printed circuit board. However, those skilled in the art will appreciate that an in-circuit tester may be adapted to supply such information regarding a defective printed circuit board directly to the computer 184 such that the operator steps of reading and then inputting such information through keyboard 202 may be avoided.

Figure 13:
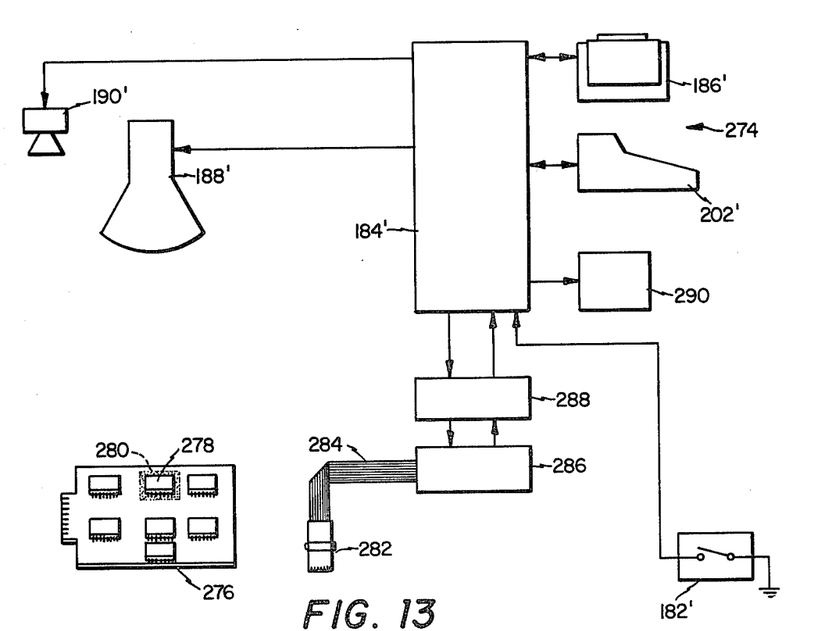

Referring now to FIG. 13, there is shown a system 274 which may be used with any of the embodiments of FIGS. 1-6 for testing individual components during the assembly or repair of a printed circuit board. The system 274 incorporates numerous component parts which are substantially identical in construction and operation to the component parts of systems 180 illustrated in FIG. 8. Such identical component parts are designated in FIG. 13 with the same reference numeral utilized in the description of system 180, but are differentiated therefrom by means of a (') designation.

The primary differentiation between system 180 and system 274 comprises the incorporation of a test clip 282 which is electrically connected by cable 284 to an in-circuit tester 286, an interface 288 for electrically connecting in-circuit tester 286 to computer 184' and a printer 290. Test clip 282 is attached to a component for testing and makes electrical contact with the desired component conducting pins. Cable 284 in turn connects in-circuit tester 286 with test clip 282 and thereby establishes electrical communication with the desired conducting pins of the tested component. In-circuit tester 286 is capable of receiving stimuli for the component being tested in the form of electrical signals or data from computer 184', inputting such data to the tested component in a predetermined sequence, receiving data generated by the tested component in response to the input data and sending such response data through interface 288 to computer 184'. Interface 288 serves to transmit data between computer 184' and in-circuit tester 286 and serves to adjust such data if necessary to make computer 184' compatible with in-circuit tester 286. Printer 290 will create permanent printed copies of information which is selectively output from computer 184'.

When a particular component is tested, it is connected to system 274 by means of testing clip 282. Data or electrical stimuli corresponding to the particular component being tested is withdrawn from storage on a floppy disk by computer 184' and disk drive 186'. The withdrawal of such data may be initiated in response to a command transmitted through switch 182' or keyboard 202' or may be initiated as a step of a programmed sequence of testing steps. Then, upon command or as part of a testing sequence, the test data is transmitted to the component being tested through interface 288 and in-circuit tester 286. Data generated by the component in response to the test data is similarly transmitted back to computer 184', through in-circuit tester 286 and interface 288, where it is compared with data representing the correct response to the test data.

Correct response data may be stored on a floppy disk and retrieved by computer 184' and disk drive 186' either at the time the testing procedure is initiated or at an appropriate time thereafter. After the actual response data is compared with the retrieved response data, printer 290, or an equivalent device such as a CRT, may indicate whether the tested component is defective. System 274 may be used to test numerous types of printed circuit board components because a library of test and response data may be stored in a floppy disk corresponding to virtually any type of standard integrated circuit or other component.

System 274 may be used in conjunction with any of the embodiments of FIGS. 1-6 to detect defective components prior to their placement on a printed circuit board during the assembly thereof or to identify defective components on a previously assembled printed circuit board which has been determined to be defective. During the assembly of a printed circuit board, the testing routine may be performed on a particular component after it has been removed from its bin or dispenser. It may be desirable to program the computer 184' to direct assembly of the printed circuit board such that where possible every component of a particular type is positioned on the printed circuit board in an uninterrupted series, thereby allowing use of the same test and response data and avoiding unnecessary time delays associated with searching for such information and retrieving it from a floppy disk or equivalent storage device.

System 274 is also easily adapted for testing individual components of a previously assembled printed circuit board. Such an operation may be particularly useful when it is discovered that a printed circuit board is defective, but the particular component or components which are themselves defective cannot be identified by testing the entire printed circuit board. Accordingly, system 274 may direct the testing of individual components on a printed circuit board by projecting the image of a particular type of component to be tested, which is generated by CRT 188', onto a half mirror or directly onto the printed circuit board as illustrated in FIG. 13.

Printed circuit board 276 has a plurality of integrated circuit modules mounted thereon. In this particular instance image 280, which is a facimile of integrated circuit 278, is projected directly onto printed circuit board 276, thus directing the operator to attach testing clip 282 to integrated circuit 278. Once this has been accomplished, system 274 will conduct a test of integrated circuit 278 either in response to an operator command or as part of a timed sequence. If integrated circuit 278 is determined by system 274 to be defective, the operator may be directed to indicate that the component is defective by placing a red flag thereon or by some other suitable indication. This procedure may be repeated for every component on the printed circuit board 276 and is preferably sequenced to test all components of the same type in a continuous sequence so that the same stimuli and correct response data may be used without requiring the unnecessary and time consuming task of retrieving such information for every test.

After all components on printed circuit board 276 have been tested, repair operations may be conducted by either of systems 180 or 274 in a manner similar to that discussed with respect to FIG. 12. It will be apparent to those skilled in the art that computer 184' may be programmed to initiate and direct repair operations immediately following the completion of the component testing, thereby obviating the need to transfer data to another machine including the location and types of components which have been identified as being defective. Otherwise, system 274 is capable of printing a list of defective components by means of printer 290 so that such information may be transferred to another operating station incorporating system 180 or 274 which will in turn direct repair operations itself.

It will also be apparent to those skilled in the are that speaker 190' may be used to selectively generate predetermined verbal instructions corresponding to each step of the testing operations. It will further be apparent to those skilled in the art that the type and location of one or more components of a printed circuit board may be input to computer 184' to allow the selective testing of particular components after repair operations have been completed on the printed circuit board, thereby ensuring the effectiveness of the repair operations.

One of the primary advantages derived from the use of the systems 180 and 274 as opposed to the prior art system 150 involves the fact that a keyboard 202(') may be utilized to prepare a series of instructions comprising steps necessary for the assembly, modification, repair and/or testing of a particular printed printed circuit board. This may be compared with the substantial amount of time and effort that would be necessary to adapt system 150 for such operations, including the preparation of slides for the projector apparatus 162, the preparation of a cartridge 168 for the tape player 166 and the wiring of the component selector indicator 154. As opposed to such a series of time consuming procedures, systems 180 and 274 may be programmed by a series of instructions input through the keyboard 202 or other suitable input device. Likewise, keyboard 202 may also be utilized to revise a series of instructions when necessary.

Another advantage derived from the use of systems 180 or 274 is the ability to store numerous programs for the assembly, modification, repair and/or testing of printed circuit boards in a medium that may be readily accessed.

Yet another advantage derived from the use of systems 180 or 274 is their ability to readily adapt for the direction of a variety of assembly, modification, repair and/or testing operations by accessing stored programs therefor.

Still another advantage derived from the use of system 274 is the ability thereof to selectively direct and perform testing operations on the components of an assembled printed circuit board or on components prior to their placement on a printed circuit board during the assembly thereof.

Another advantage derived from the use of system 274 is the ability thereof to direct repair operations on printed circuit boards in response to the identification of the type and location of defective components.

It will thus be understood that the present invention comprises a fully automated system for the assembly, modification, repair and/or testing of printed circuit boards which substantially eliminates any possibility of error with respect to such procedures.

Although particular embodiments of the invention have been illustrated in the accompanying Drawings and described in the foregoing Detailed Description, it will be understood that the invention is not limited to the embodiments disclosed, but is capable of numerous rearrangements, modifications and substitutions of parts and elements without departing from the spirit of the invention.

I claim:

1. A printed circuit board operation system comprising:
    work station means for orienting and retaining a printed circuit board to be operated upon;
    means forming an image projection surface;
    means for positioning the image projection surface in a predetermined orientation with respect to the work station means;
    image projection means for generating on the image projection surface a series of images each corresponding to the type and location of an operational step relative to the printed circuit board in the work station means;
    means for generating verbal instructions pertaining to the direction of the operational steps relative to the printed circuit board in the work station means; and
    means for sequentially actuating, the image projection means and the verbal instruction generating means to produce a sequence of instructions comprising the operation sequence for the printed circuit board in the work station means.

2. The printed circuit board operation system according to claim 1 wherein the image projection surface comprises a half mirror and wherein the positioning means locates the half mirror to receive the image from the image projection means while simultaneously facilitating observation of the printed circuit board in the work station means through the half mirror.

3. The printed circuit board operation system according to claim 1 wherein the image projection surface comprises the surface of the printed circuit board in the work station means, and wherein the image projection means functions to project images directly onto the surface of the printed circuit board.

4. The printed circuit board operation system according to claim 1 wherein the image projection means is periodically actuated to project an image comprising illustrations of a plurality of operational steps previously conducted on the printed circuit board in the work station means for the purpose of checking previous operational steps.

5. The printed circuit board operation system according to claim 1 wherein the verbal instruction generating means includes speaker means and means responsive to a series of prerecorded instructions for actuating the speaker means.

6. The printed circuit board operation system according to claim 1 wherein the verbal instruction generating means comprises speaker means, instruction storage means and synthesizer means responsive to the instruction of the storage means for actuating the speaker means.

7. The printed circuit board operation system according to claim 1 wherein a plurality of the images each correspond to the location of a cutting point relative to the etched face of a printed circuit board in the work station means.

8. The printed circuit board operation system according to claim 1 wherein a plurality of the images each correspond to the location of a lead wire path and lead wire adhesive points relative to the etched face of a printed circuit board in the work station means.

9. The printed circuit board operation system according to claim 1 further comprising:
    means forming an array of printed circuit board components located adjacent the work station means;
    means for designating a particular printed circuit board component from the array; and
    wherein the actuating means sequentially actuates the designator means, the image projection means and the verbal instruction generating means to produce the sequence of instructions comprising the operation sequence for the printed circuit board in the work station means.

10. The printed circuit board operation system according to claim 9 wherein a plurality of the images each corespond to the positioning and orientation of a component relative to the printed circuit board in the work station means and the verbal instructions pertain to the selection, positioning and orientation of components relative to the printed circuit board in the work station means.

11. The printed circuit board operation system according to claim 9 wherein the printed circuit board component array includes a plurality of component storage bins, and wherein the component designator means includes means for generating a visually receivable signal indicative of the bin containing a particular component.

12. The printed circuit board operation system according to claim 9 wherein the printed circuit board component array includes at least one integrated circuit dispenser, and wherein the component designator means includes means for actuating the integrated circuit dispenser to dispense a preselected integrated circuit therefrom.

13. The printed circuit board operation system according to claim 9 wherein the image projection means is actuated to project a series of images each comprising a full color image of the component means assembled onto the printed circuit board in the work station means with each image located and oriented in accordance with the correct positioning and orientation of the component being assembled.

14. The printed circuit board operation system according to claim 1 wherein:

the printed circuit board component array includes a plurality of component storage bins and at least one integrated circuit dispenser;

wherein the printed circuit board component designator means includes means for selectively generating a visually perceptible signal indicative of the particular component storage bin containing the component to be assembled onto the printed circuit board at the work station means;

the printed circuit board component designator means further includes means for selectively actuating the integrated circuit dispenser to dispense a preselected integrated circuit therefrom;

the image projection means comprises means for generating a series of full color images of components with each component image being located and oriented in accordance with the correct positioning and orientation of the component on the printed circuit board means; and the verbal instruction generating means includes speaker means, instruction storage means and means responsive to the instruction storage means for actuating the speaker means.

15. A printed circuit board operation system comprising:

work station means for orienting and retaining a printed circuit board to be assembled;

means for storing a plurality of printed circuit board components and a printed circuit board component storage array located adjacent to the work station means;

means for storing a plurality of printed circuit board component designations each corresponding to a particular printed circuit board component from the component array;

means responsive to the stored printed circuit board component designations for sequentially designating particular printed circuit board components from the component array to be assembled onto the printed circuit board in the work station means;

means for storing a plurality of printed circuit board component images each corresponding to one of the printed circuit board components from the component array and for storing a plurality of operational step images each corresponding to a specific modification to be made on the etched face of a printed circuit board;

means responsive to the image storage means for projecting the images sequentially such that each component image is projected at a location and in an orientation corresponding to the correct positioning and orientation of the component on the printed circuit board in the work station and such that each operational step image is projected at a location corresponding to the correct positioning of the modification on the printed circuit board in the work station;

means for storing a plurality of verbal instructions each corresponding to the selection of a particular printed circuit board component from the component array, to the positioning of the selected component relative to the printed circuit board in the work station means, to the orientation of the selected component relative to the printed circuit board in the work station means and to the specific type and location of a modification relative to the printed circuit board in the work station means; and means responsive to the verbal instruction storage means for generating a sequence of verbal instructions corresponding to the desired sequence of assembling components from the component array onto the printed circuit board in the work station means and corresponding to the desired sequence of modifying the etched face of the printed circuit board in the work station means.

16. The printed circuit board operation system according to claim 15 wherein the printed circuit board component array includes a plurality of printed circuit board component storage bins, and means for visually identifying the particular bin having a predetermined printed circuit board component stored therein.

17. The printed circuit board operation system according to claim 15 wherein the printed circuit board component array includes at least one integrated circuit dispenser, and means for selectively dispensing preselected integrated circuits from the integrated circuit dispenser.

18. The printed circuit board operation system according to claim 15 further including a half mirror, means for positioning the half mirror over the work station means to permit observation of the printed circuit board in the work station means through the half mirror, and wherein the image projection means projects images onto the half mirror.

19. The printed circuit board operation system according to claim 15 wherein the printed circuit board component image storage means comprises a series of photographic images arranged in a predetermined sequence corresponding to the operational sequence for the printed circuit board in the work station means, and wherein the image projection means comprises means for projecting the photographic images onto a projection surface located in a predetermined orientation relative to the printed circuit board in the work station means.

20. The printed circuit board operation system according to claim 15 wherein the image storage means comprises a memory having a plurality of electromagnetic signals stored therein capable of instructing the generation of a visual image of each of the printed circuit board components from the component array and instructing the generation of a visual image of each operational step modifying the etched face of a printed circuit board, a cathode-ray tube, and means responsive to the memory for actuating the cathode-ray tube to project images of printed circuit board components stored in the component array and operational steps modifying the etched faced the printed circuit board onto a projection surface situated in a predetermined orientation relative to the printed circuit board in the work station means.

21. The printed circuit board operation system according to claim 15 wherein the image projection means projects the images directly onto the surface of the printed circuit board in the work station means.

22. The printed circuit board operation system according to claim 15 wherein a plurality of operational step images each designate the location on the etched face of a printed circuit board at which a conducting path is to be cut.

23. The printed circuit board operation system according to claim 15 wherein a plurality of operational step images each designate a path on the etched face of a printed circuit board along which an insulated lead wire is to be mounted and the points along the path at which the lead wire is to be adhesively affixed to the pointed circuit board.

24. The printed circuit board operation system according to claim 15 wherein the verbal instruction generating means comprises a plurality of prerecorded verbal instructions arranged in a predetermined sequence in accordance with the desired sequence of assembly of components from the component array onto the printed circuit board in the work station means and in accordance with the desired sequence of modifications to be made on the etched face of the printed circuit board in the work station means, and means responsive to the prerecorded instructions for generating a series of verbal instructions.

25. The printed circuit board operation system according to claim 15 wherein the verbal instruction generating means includes memory means for storing a plurality of electromagnetic signals each corresponding to the selection, positioning and orientation of a component from the component array onto the printed circuit board in the work station means and for storing a plurality of electromagnetic signals each corresponding to the location and direction of a modification the etched face of a printed circuit board in the work station means, and means responsive to the electromagnetic signals stored in the memory means for generating verbal instructions in a predetermined sequence corresponding to the desired sequence of assembly of components from the component array onto the printed circuit board in the work station means and corresponding to the desired sequence of operational steps to be performed on the etched face of the circuit board in the work station means.

26. The printed circuit board operation system according to claim 15 wherein:
the printed circuit board component array includes a plurality of bins each for storage of a predetermined printed circuit board component and visual indicating means for selective actuation to designate a particular component storage bin;
wherein the printed circuit board component array further includes at least one integrated circuit dispenser for selective actuation to dispense a preselected integrated circuit therefrom;
the visual image storage means comprises memory means having a plurality of electromagnetic signals stored therein each corresponding either to a visual image of one of the components from the component array or corresponding to a visual image of a modification of the etched face of the printed circuit board, a cathode-ray tube, and means responsive to the electromagnetic signals stored in the memory means for actuating the cathode-ray tube to project a series of visual images each corresponding either to a circuit board component stored in the component array or to a visual image of a modification of the etched face of the printed circuit board; and
the verbal instruction storage means includes memory means having a plurality of electromagnetic signals contained therein each corresponding either to instructions with respect to the storage, positioning and orientation of components from the component array onto the printed circuit board in the work station means or to the location and direction of a modification to the etched face of a printed circuit board in the work station means; and
the verbal instruction generating means comprises means responsive to electromagnetic signals stored in the memory means for generating a sequence of verbal instructions in accordance with the desired assembly sequence of components from the storage array onto the printed circuit board in the work station means and in accordance with the desired modification sequence of operational steps to be performed on the etched face of the printed circuit board in the work station means.

27. A printed circuit board operation system comprising:
means forming an image projection surface;
means for positioning the image projection surface in a predetermined orientation with respect to a work station means;
image projection means for generating on the image projection surface a series of images each corresponding to the positioning and orientation of a component relative to the printed circuit board;
means for sequentially actuating the image projection means to produce a sequence of projections in accordance with the order in which individual components of a printed circuit board are to be operated upon.

28. The printed circuit board component operation system according to claim 27 further comprising:
means for receiving data indicating the location of a component to be operated upon on the printed circuit board; and
means for storing the data received by the data receiving means and for retrieving the data upon command, wherein the image projection means is actuated in response to the data received by the data receiving means.

29. The printed circuit board component operation system according to claim 27 wherein the data comprises a plurality of electrical signals which are generated exterior to the data receiving means.

30. The printed circuit board component operation system according to claim 27 wherein the data comprises a plurality of electrical signals which are generated by the data receiving means in response to operator actuation.

31. The printed circuit board operation system according to claim 27 wherein the image projection surface comprises the surface of a printed circuit board and wherein the image projection means functions to project images directly onto the surface of the printed circuit board.

32. The printed circuit board operation system according to claim 27 wherein the image projection surface comprises a half mirror positioned to receive the images from the image projection means while facilitating observation of the printed circuit board through the half mirror.

33. The printed circuit board operation system according to claim 27 wherein the images each designate the location and type of a component on the circuit board which has been determined to be defective.

34. The printed circuit board operation system according to claim 27 wherein the sequence of projections advances in response to actuation of a switch means following the completion of each operational step.

35. The printed circuit board operation system according to claim 27 further comprising:
means for testing a component identified by each image to determine whether the component is defective, the testing means being actuated synchronously with respect to the sequence of image projections.

36. The printed circuit board operation system according to claim 35 further comprising:
means for receiving data indicating the location on a printed circuit board of a component to be tested;
means for storing the data received by the data receiving means and retrieving the data upon command, wherein the image projection means is actuated in response to the data received by the data receiving means, the testing means includes means for receiving and storing test data and correct response data corresponding to a component identified by each image and means for stimulating a component with its respective test data, receiving data from the component in response to the test data and comparing the response data with the correct response data; and
means actuated by the testing means in response to the comparison of the component response data and the correct response data for indicating whether the component is defective.

37. The printed circuit board operation system according to claim 35 wherein the component testing means is capable of testing printed circuit board components prior to the mounting thereof onto a circuit board in the location and orientation designated by the projected images and is capable of testing printed circuit board components already mounted onto a circuit board.

38. The printed circuit board operation system according to claim 36 further comprising a programmable computer, which is in electrical communication with the component location data receiving means, for coordinating actuation of the image projection means, the component testing means, the component location data storage and retrieval means and the defective component indicating means.

39. The printed circuit board operation system according to claim 38 wherein the component location data receiving means comprises a disk drive, which is in electrical communication with the programmable computer, for generating and retrieving a plurality of electromagnetic pulses from a storage medium.

40. The printed circuit board operation system according to claim 38 wherein the component location data retrieving means comprises a keyboard, which is in electrical communication with the programmable computer, for generating a plurality of electrical signals in response to operator actuation.

41. The printed circuit board operation system according to claim 38 wherein the testing means comprises:
a disk drive, which is in electrical communication with the programmable computer, for storing and retrieving test data and correct response data in the form of electromagnetic pulses corresponding to a plurality of components;
a keyboard, which is in electrical communication with the programmable computer, for receiving test data and correct response data corresponding to a plurality of components;
an in-circuit tester, which is in electrical communication with the programmable computer through an interface and which is capable of being electrically connected to the conducting pins of a printed circuit board component by means of a testing clip and cable, for stimulating a component with test data retrieved by the disk drive and for receiving data from a component in response to test data; and
wherein the programmable computer compares component response data to correct response data retrieved by the disk drive to determine whether a component is defective.

42. The printed circuit board operation system according to claim 38 wherein the image projection means comprises a cathode ray tube and the image projection surface comprises the surface of a printed circuit board such that the images are projected directly onto the printed circuit board.

43. The printed circuit board operation system according to claim 38 wherein the image projection means comprises a cathode ray tube and the image projection surface comprises a half mirror positioned to receive the images from the cathode ray tube while facilitating observation of the printed circuit board through the half mirror.

44. The printed circuit board operation system according to claim 38, further comprising a means for storing and generating audible verbal instructions, which is in electrical communication with the programmable computer, for directing the testing of a printed circuit board component, and wherein the programmable computer actuates the generation of the verbal instructions during printed circuit board component testing.

45. The printed circuit board operation system according to claim 38 further comprising a printer, which is in electrical communication with the programmable computer and which is actuated thereby during printed circuit board component testing for printing the location and type of a component determined to be defective.

46. A method of modifying the etched face of a circuit board comprising:
determining one or more modifications desired to be made to said etched face of said circuit board;
generating a plurality of images each corresponding to one of said desired modifications; and
projecting said images to a location and in an orientation relative to said circuit board such that said images visually indicate the precise location and type of modification desired to be made to said circuit board.

47. The method of modifying the etched face of a circuit board according to claim 46 wherein said image projection is sequenced in a series corresponding to the order in which said modifications are desired to be performed.

48. The method of modifying the etched face of a circuit board according to claim 46 further comprising generating audible verbal instructions corresponding to said image generation and projection for directing the modification of said circuit board.

49. The method of modifying the etched face of a circuit board according to claim 46 wherein said images are projected directly onto said etched face of said circuit board.

50. The method of modifying the etched face of a circuit board according to claim 46 wherein said images are projected onto the surface of a half mirror disposed for receiving said images and for facilitating observation of the printed circuit board through said half mirror.

51. The method of modifying the etched face of a circuit board according to claim 47 wherein each step of said image projection sequence follows the completion of modification operations on said circuit board which correspond to the preceding step of said image projection sequence.

52. The method of modifying the etched face of a circuit board according to claim 47 further comprising simultaneously projecting each of said images to a location and in an orientation relative to said circuit board upon completion of said sequence such that every modification desired to be made to said circuit board is visually indicated thereby.

53. A method of detecting and indicating which components on a circuit board are defective comprising:
generating a plurality of images, each corresponding to one of said components;
selectively projecting each of said images to a location and in an orientation relative to said circuit board such that said images visually indicate the precise type and location of the component to be tested;
testing said indicated component by inputting predetermined electrical stimuli to the component being tested and comparing the corresponding output thereto with a predetermined correct response; and
indicating that the particular component being tested is defective if the output corresponding to the predetermined electrical stimuli does not match said predetermined correct response.

54. The method of detecting and indicating which components on a circuit board are defective according to claim 53, wherein said images are projected sequentially in a series corresponding to the order in which said components are desired to be tested.

55. A method of detecting and indicating which components on a circuit board are defective comprising:
identifying the location and type of any of said components which are defective;
generating an image for each of said components which are identified as being defective in direct response to said identification; and
selectively projecting each of said images to a location and in an orientation relative to said circuit board such that said images visually indicate the precise location and type of each of said components identified as being defective.

56. A method of identifying defective components during the assembly of a circuit board prior to the placement thereof on said circuit board comprising:
selectively indicating and dispensing each of said components which are to be placed on said circuit board in a sequence corresponding to the order of their placement on said circuit board;
testing each of said components prior to placement thereof on said circuit board by inputting predetermined electrical stimuli thereto and comparing the corresponding output in response to said stimuli with a predetermined correct response; and
indicating prior to the placement of each of said components on said circuit board that the particular component being tested is defective if said output corresponding to said predetermined electrical stimuli does not match the predetermined correct response.

* * * * *